United States Patent
Ishikawa

(10) Patent No.: US 6,654,064 B2
(45) Date of Patent: Nov. 25, 2003

(54) IMAGE PICKUP DEVICE INCORPORATING A POSITION DEFINING MEMBER

(75) Inventor: Koji Ishikawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/081,931

(22) Filed: May 21, 1998

(65) Prior Publication Data

US 2003/0025824 A1 Feb. 6, 2003

(30) Foreign Application Priority Data

May 23, 1997 (JP) .............................. 9-133565
Mar. 11, 1998 (JP) ............................ 10-076448

(51) Int. Cl.⁷ .............................................. H04N 1/028
(52) U.S. Cl. ...................... 348/374; 348/340; 250/239
(58) Field of Search ................................ 348/374, 340, 348/373, 335, 76; 439/66; 250/239

(56) References Cited

U.S. PATENT DOCUMENTS

| | | | | |
|---|---|---|---|---|
| 4,457,017 A | * | 6/1984 | Onogi et al. ................. | 250/239 |
| 4,581,657 A | * | 4/1986 | Takano ........................ | 250/239 |
| 4,594,613 A | * | 6/1986 | Shinbori et al. ............. | 348/340 |
| 5,153,734 A | * | 10/1992 | Kanamori et al. .......... | 348/340 |
| 5,559,556 A | * | 9/1996 | Kagebeck ................... | 348/374 |
| 5,739,853 A | * | 4/1998 | Takahashi ................... | 348/374 |
| 5,748,448 A | * | 5/1998 | Hokari ........................ | 257/432 |
| 5,753,908 A | * | 5/1998 | Christensen ................ | 250/239 |
| 5,825,560 A | * | 10/1998 | Ogura et al. ................ | 348/335 |
| 5,828,409 A | * | 10/1998 | North et al. ................. | 348/374 |
| 5,835,142 A | * | 11/1998 | Nakamura et al. ......... | 348/335 |
| 5,894,368 A | * | 4/1999 | Yamanaka .................. | 348/337 |
| 5,998,786 A | * | 12/1999 | Movaghar et al. ......... | 250/239 |
| 6,072,126 A | * | 6/2000 | Shiga et al. ................ | 174/250 |
| 6,285,400 B1 | * | 9/2001 | Hokari ........................ | 348/374 |

FOREIGN PATENT DOCUMENTS

JP          09018649 A    *    1/1997    .......... H04N/1/028

* cited by examiner

Primary Examiner—Wendy R. Garber
Assistant Examiner—Jason Whipkey
(74) Attorney, Agent, or Firm—Fitzpatrick, Cella, Harper & Scinto

(57) ABSTRACT

An image pickup device is provided with an optical system for taking the image of an object. A photoelectric converting element photoelectrically converts the object image taken by the optical system and an electric signal outputting board outputs an electrical signal from the photoelectric converting element. A position defining member defines the position of the optical system relative to the photoelectric converting element. The electric signal outputting board is positioned between the photoelectric converting element and the position defining member.

7 Claims, 8 Drawing Sheets

IMAGE PICKUP DEVICE INCORPORATING A POSITION DEFINING MEMBER

BACKGROUND OF THE INVENTION

1. Field of the Invention

The present invention relates to an image pickup element or a mounting device therefor, for use in an image pickup apparatus such as a video camera or a digital camera.

2. Related Background Art

FIG. 1 is a vertical cross-sectional view schematically showing the configuration of an image pickup device, employing a solid-state image pickup element contained in a conventional discrete package.

In FIG. 1 there are shown a package 1 for the solid-state image pickup element; an image pickup optical lens system 2; and a position defining member 3 for defining the position of the package 1 for the solid-state image pickup element relative to the image pickup optical system 2.

The relative position of the package 1 of the solid-state image pickup element and the position defining member 3 along a plane perpendicular to the optical axis is defined by an unrepresented positioning jig. Also the relative position of the package 1 and the position defining member 3 along the optical axis is fixed by adhesion, with the impingement of the position defining member 3 on the rear face, constituting a reference plane, of the package 1. Electrode portions 4 of the package 1 pass through apertures 5 provided in the position defining member 3 and are inserted into holes 7 formed on a printed circuit board 6 positioned at the rear side of the position defining member 3, and are fixed at the rear face of the printed circuit board 6 by soldering 8 to rands formed on the rear face thereof. Also the position defining member 3, on which the solid-state image pickup package 1 is fixed, impinges on the image pickup optical system 2 for defining the position of the solid-state image pickup element 9 in the axial direction relative to the image pickup optical system 2, and positioning holes 10 provided on the position defining member 3 engage with positioning projections 11 correspondingly provided on the image pickup optical system 2 for defining the position of the solid-state image pickup element 9 relative to the image pickup optical system 2 along the plane perpendicular to the optical axis. In this configuration, a shield case 12 is mounted on the printed circuit board 6, so as to cover the electrode portions 4 of the solid-state image pickup package 1 fixed by solderings 8 to the rear face of the printed circuit board 6.

FIG. 2 is a vertical cross-sectional view, schematically showing another configuration of an image pickup device, in which the package containing the above-mentioned solid-state image pickup element is so modified that the electrode portions 4 are bent. In FIG. 2, the same portions as those in FIG. 1 are represented by the same numbers as in FIG. 1.

Referring to FIG. 2, the relative position between the solid-state image pickup package 1 and the position defining member 3 along the plane perpendicular to the optical axis is defined by an unrepresented positioning jig, while the relative position in the axial direction is fixed by adhesion, upon impingement of the position defining member 3 on the reference rear face of the solid-state image pickup package 1. The electrode portions 4 of the package 1 pass through the apertures 5 provided in the position defining member 3 and are fixed at the rear face of the printed circuit board 6, positioned at the rear side of the position defining member 3, by soldering 8 to rands formed on the front surface of the printed circuit board 6. Also the position defining member 3, on which the solid-state image pickup package 1 is fixed, impinges on the image pickup optical system 2 for defining the position of the solid-state image pickup element 9 in the axial direction relative to the image pickup optical system 2, and positioning holes 10 provided on the position defining member 3 engage with positioning projections 11 correspondingly provided on the image pickup optical system 2 for defining the position of the solid-state image pickup element 9 relative to the image pickup optical system 2 along the plane perpendicular to the optical axis.

In the conventional configuration shown in FIG. 1, however, since the electrode portions 4 are fixed by solderings 8 to the rear surface of the printed circuit board 6, such soldered portions 8 protrude on the rear side thereof and constitute a dead space against the compactization of the equipment. Also the solid-state image pickup element 9 is very susceptible to the influence of noises, but a shield case 12, if provided for avoiding such influence, increases the total thickness, hindering also the compactization of the equipment.

On the other hand, in the above-described configuration shown in FIG. 2, in which the electrode portions 4 of the package 1 containing the solid-state image pickup element 9 are bent in L-shape, the soldered portions 8 of the electrode portions 4 are present on the front surface of the printed circuit board 6 and do not protrude to the rear surface thereof, thus eliminating the dead space on the rear surface of the printed circuit board 6 as in the configuration shown in FIG. 1. Also on a surface of the printed circuit board 6, opposite to the surface electrically connected to the solid-state image pickup package 1, there is provided a ground pattern substantially covering the printed circuit board 6 to obtain the shield effect, thereby dispensing with the shield case which is a factor increasing the total thickness in the configuration shown in FIG. 2.

In the configuration shown in FIG. 2, however, in forming the electrode portions 4 into L shape, such portions have to be chucked and a chucking area for this operation has to be secured, so that the gap from the mounting face of the position defining member 3 for the solid-state image pickup package 1 to the bent position of the electrode portions 4 cannot be made small. For this reason, the distance L from the solid-state image pickup package 1 to the printed circuit board 6 has a certain lower limit, thus hindering the reduction in the total thickness. Furthermore, the length from the rear face of the solid-state image pickup package 1 to the bent position of the electrode portions 4 tends to fluctuate considerably. Also, cracking tends to appear in the forming operation if the electrode portions are chucked incompletely. Furthermore, the image pickup element may be damaged by the electromotive force generated at the forming operation.

SUMMARY OF THE INVENTION

The present invention is to resolve the drawbacks mentioned in the foregoing, and a first object thereof is to provide a surface mountable image pickup device of a thin structure for mounting.

A second object of the present invention is to provide an image pickup device and a leadless electric component mounting device, capable of reducing the total thickness of the image pickup device.

A third object of the present invention is to provide an image pickup device and a leadless electric component mounting device, capable of providing a shield effect without utilizing the shield case which is a factor for increasing the total thickness.

The above-mentioned first object can be attained, according to a preferred embodiment of the present invention, by a surface mountable leadless image pickup element in which a light receiving face is formed on the upper face in a flat package, the lower face of the package is used as a position defining face in the axial direction, and plural electrodes for soldering are formed in at least mutually opposed pair of lateral faces, among the four lateral faces, of the flat package.

Also the above-mentioned second object can be attained, according to a preferred embodiment of the present invention, by an image pickup device comprising an optical system for picking up the image of an object, photoelectric conversion means for photoelectric conversion of the object image picked up by the optical system, electric signal output means for outputting electric signals from the photoelectric conversion means, and position defining means for defining the relative position of the optical system and the photoelectric conversion means, wherein the electric signal output means is positioned between the photoelectric conversion means and the position defining means.

Also the above-mentioned third object can be attained, according to a preferred embodiment of the present invention, by a leadless electric component mounting device for mounting a leadless electric component in a mounting position in the device, comprising a position defining member for mounting the leadless electric component in a part with a predetermined gap and positioning the leadless electric component in the mounting position, and a printed circuit board electrically connected to the electrodes of the leadless electric component and derived through the above-mentioned gap.

Still other objects of the present invention, and the features thereof, will become fully apparent from the following description, which is to be taken in conjunction with the attached drawings.

DETAILED DESCRIPTION OF THE PREFERRED EMBODIMENTS

Figure 3:
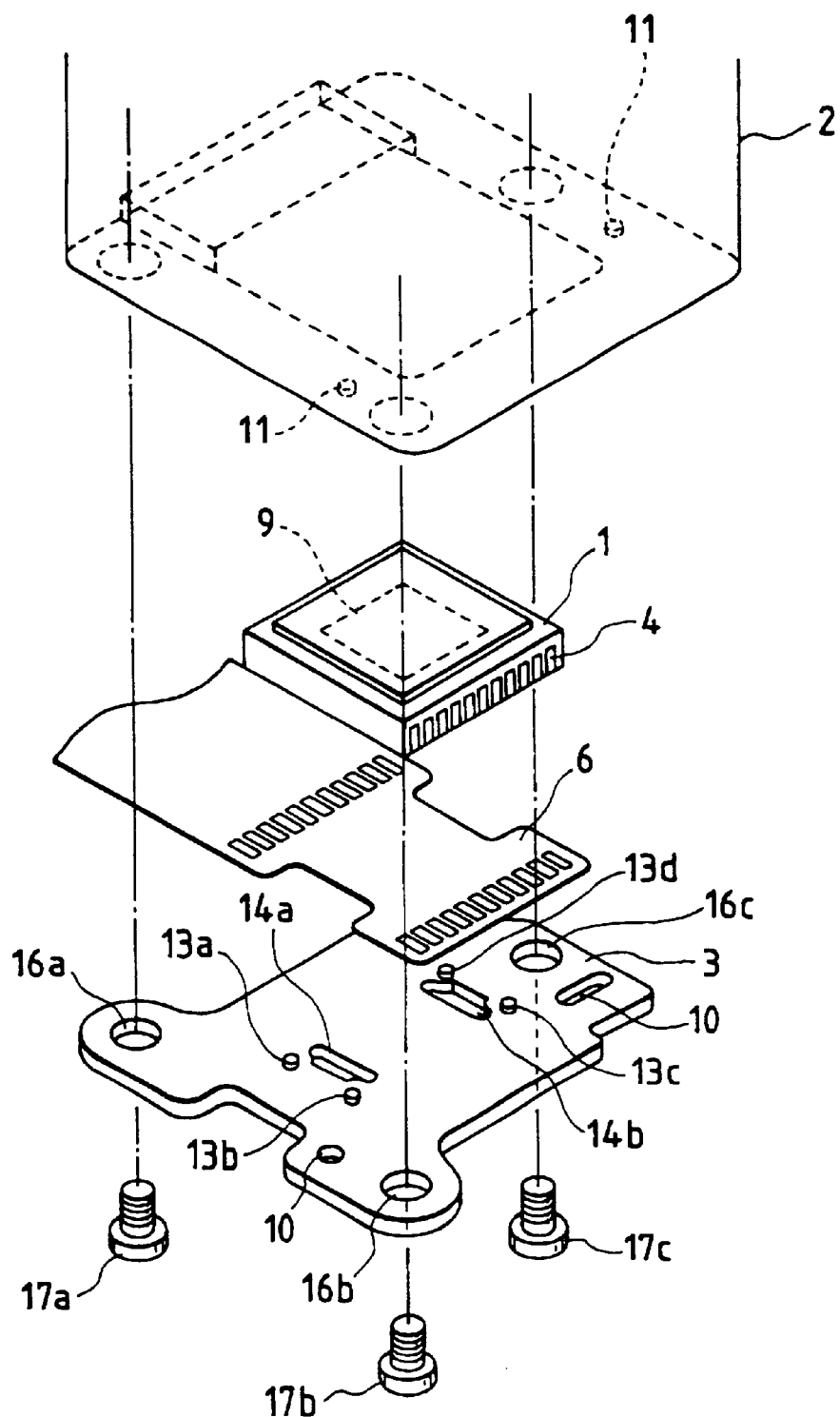
FIG. 3 is an exploded perspective view showing the configuration of a first embodiment of the present invention.
Figure 4:
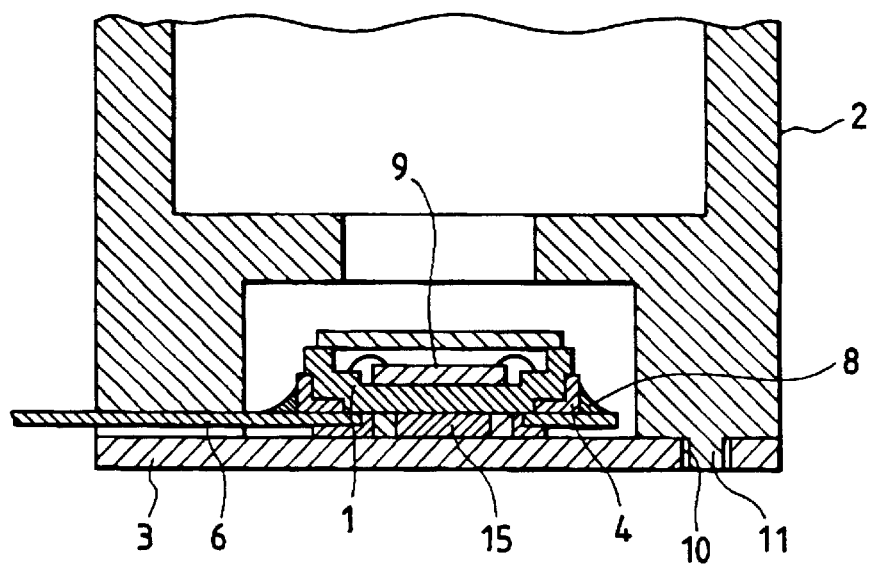
FIG. 4 is a longitudinal cross-sectional view showing the configuration, in an assembled state, of an image pickup device constituting the first embodiment of the present invention.
Figure 5:
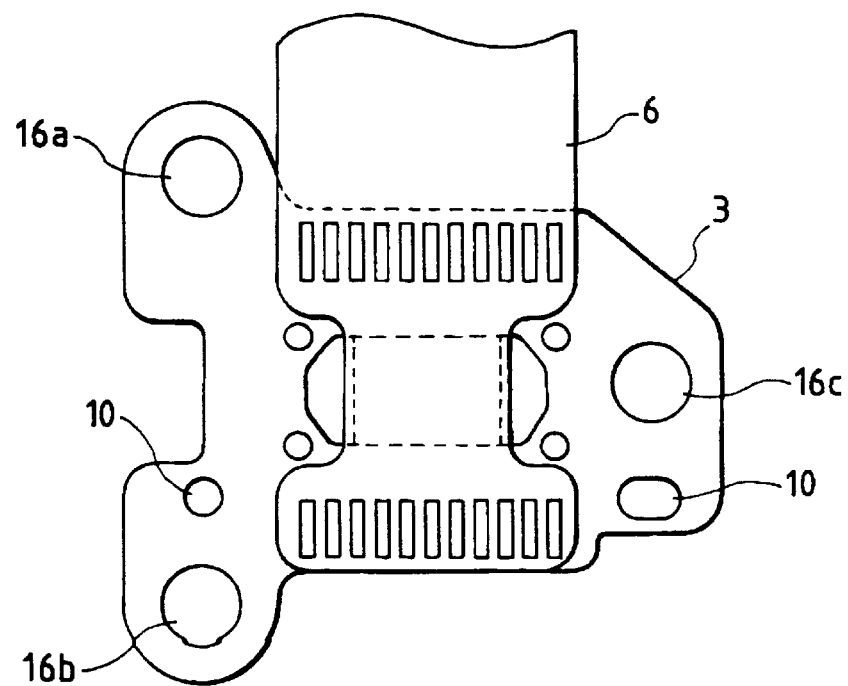
FIG. 5 is a plan view, with the package of the solid-state image pickup element being removed, showing the configuration of the image pickup device of the first embodiment.

At first there will be explained a first embodiment of the present invention with reference to FIGS. 3 to 5 and 6A to 6C, wherein FIG. 3 is an exploded perspective view showing the configuration of an image pickup device (leadless electric component mounting device) constituting a first embodiment of the present invention; FIG. 4 is a longitudinal cross-sectional view showing the configuration, in an assembled state, of an image pickup device constituting the first embodiment of the present invention; FIG. 5 is a plan view showing the configuration of the image pickup device of the first embodiment in the assembled state, wherein the image pickup optical system and the package of the solid-state image pickup element are removed; and FIGS. 6A to 6C are respectively a plan view, a lateral view and a bottom view showing the configuration of the package for the solid-state image pickup element employed in the image pickup device of the first embodiment.

Figure 1:
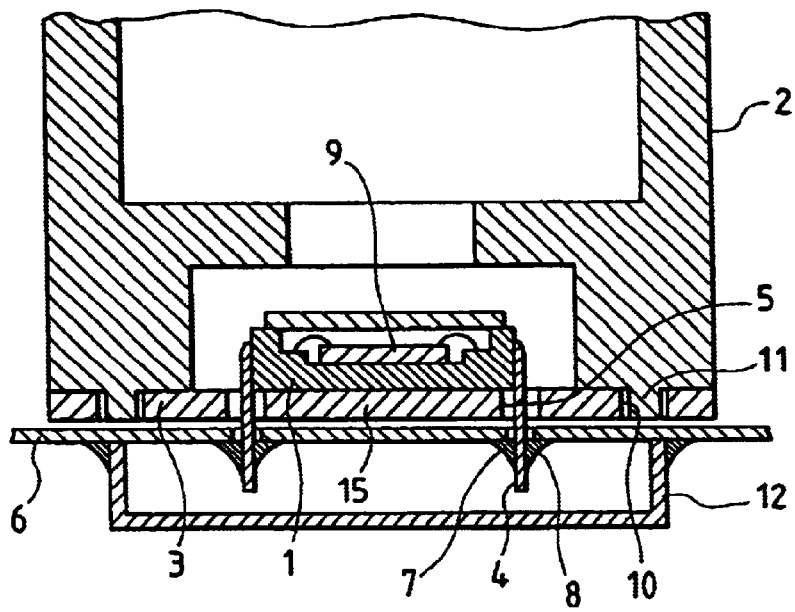
FIG. 1 is a longitudinal cross-sectional view showing the configuration of a conventional image pickup device.
Figure 2:
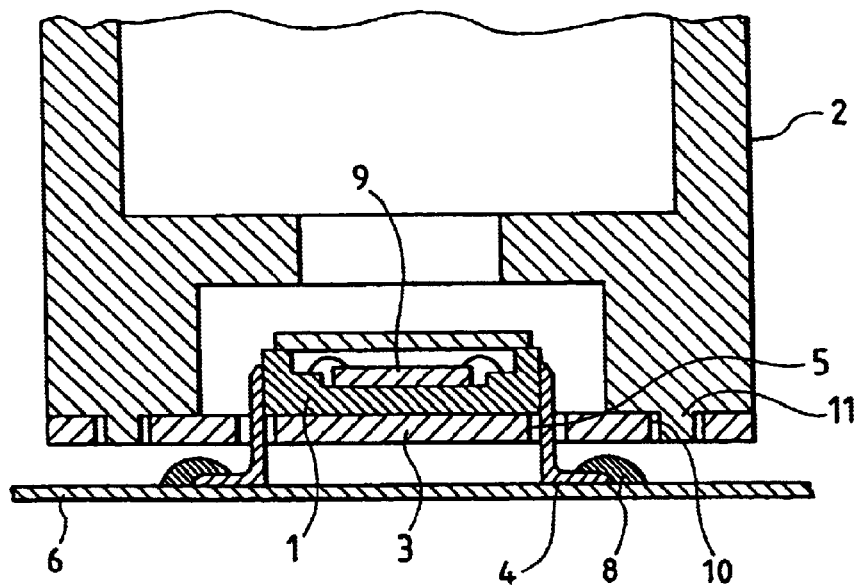
FIG. 2 is a longitudinal cross-sectional view showing the configuration of another conventional image pickup device.

In FIGS. 3 to 5 and 6A to 6C, the same components as those in FIGS. 1 and 2 are represented by the same numbers as therein.

Referring to FIGS. 3 and 4, there are shown a package 1 for the solid-state image pickup element; an image pickup optical system 2; a position defining member 3; electrode portions 4; and a printed circuit board 6.

Figure 6A:
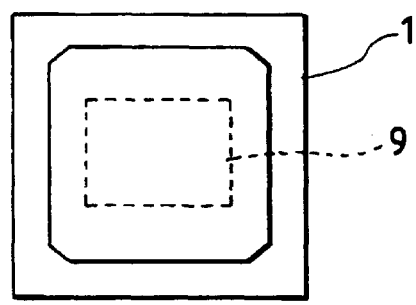
FIGS. 6A, 6B and 6C are views showing the configuration of a package for the solid-state image pickup element employed in the image pickup device of the first embodiment.
Figure 6B:
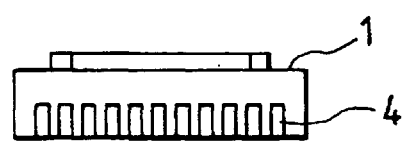
Figure 6C:
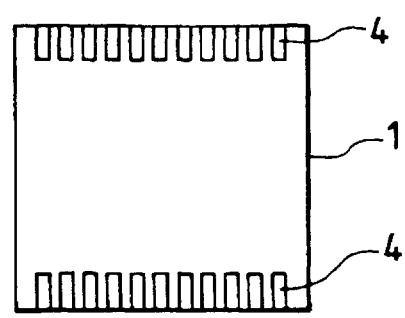

The package 1 for the solid-state image pickup element is of a leadless chip carrier type having the electrode portions 4 at the end faces of the package as shown in FIGS. 6A to 6C. The printed circuit board 6 is a flexible printed circuit board, provided with a pattern for outputting the signal from the solid-state image pickup element (leadless electric component) 9 and soldering rands for electrical connection therewith.

Referring to FIG. 3, after the electrode portions 4 of the solid-state image pickup package 1 are soldered to the rands formed on the printed circuit board 6, the relative position of the package 1 and the position defining member 3 along the plane perpendicular to the optical axis is defined by an unrepresented positioning jig. Also the relative position of the package 1 and the position defining member 3 along the optical axis is defined by the impingement of the package 1 on plural projections 13a to 13d provided on the position defining member 3, and the package 1 and the position defining member 3 are fixed by adhesion by introducing an adhesive material 15 into the gap therebetween through apertures 14a, 14b provided in the vicinity of the projections 13a to 13d.

Then the position defining member 3, supporting the solid-state image pickup package 1 thereon, is made to impinge on the image pickup optical system 2, thereby defining the axial position of the solid-state image pickup element 9 relative to the image pickup optical system 2. In this state the positioning holes 10 provided on the position defining member 3 engage with the positioning projections 11 provided correspondingly on the image pickup optical system 2 to define the position of the solid-state image pickup element 9 relative to the optical system 2 along the plane perpendicular to the optical axis.

Since the projections 13a to 13d provided on the position defining member 3 have a height h satisfying a condition $h \geq t$ wherein t is the thickness of the printed circuit board 6, the printed circuit board 6 can be positioned between the solid-state image pickup package 1 and the position defining member 3.

Also as the apertures 14a, 14b formed on the position defining member 3 for introducing the adhesive material are positioned in the vicinity of the projections 13a to 13d of the position defining member 3, the package 1 and the position defining member 3 are adhered in mutually contacting areas thereof and in the surrounding areas to attain a high adhesion strength. If the apertures 14a, 14b of the position defining member 3 are separated from the projections 13a to 13d, the adhesion between the package 1 and the position defining member 3 is to be made across the gap therebetween, so that there cannot be obtained a sufficient strength.

The printed circuit board 6 is so shaped as to substantially cover the rear face of the solid-state image pickup package 1 but so as to be absent in the portions where the projections 13a to 13d formed on the position defining member 3 are in contact with the package 1 and in the portions of the apertures 14a, 14b for introducing the adhesive material 15, whereby the rear face of the solid-state image pickup package 1 is exposed in portions corresponding to the projections 13a to 13d and the apertures 14a, 14b and such exposed portions constitute adhering areas for the package 1 and the position defining member 3.

The printed circuit board 6 is positioned between the solid-state image pickup package 1 and the position defining member 3 of the above-described configuration, and the package 1 is supported and fixed by the projections 13a to 13d formed on the position defining member 3, so that the height h of the projections 13a to 13d can be extremely precisely determined at a value close to the thickness t of the printed circuit board 6. It is therefore rendered possible to reduce the gaps of the package 1, the position defining member 3 and the printed circuit board 6, thereby reducing the entire thickness.

Also as the electrode portions 4 of the solid-state image pickup package 1 are electrically connected to a face, at the side of the package 1, of the printed circuit board 6, the electrode portions 4 of the package 1 and the soldered portions 8 do not protrude on the rear face of the printed circuit board 6, whereby a dead space is not created on the rear face.

Furthermore, a shield effect can be obtained by forming a ground pattern substantially covering the printed circuit board 6, on a face thereof opposite to the face where electrical connection is made with the electrode portions 4 of the package 1.

In FIGS. 3 and 4 there are also shown bolt holes 16a, 16b, 16c formed on the position defining member 3, and bolts 17a, 17b, 17c are inserted into these bolt holes 16a to 16c to fix the position defining member 3 to the image pickup optical system 2.

Figure 7:
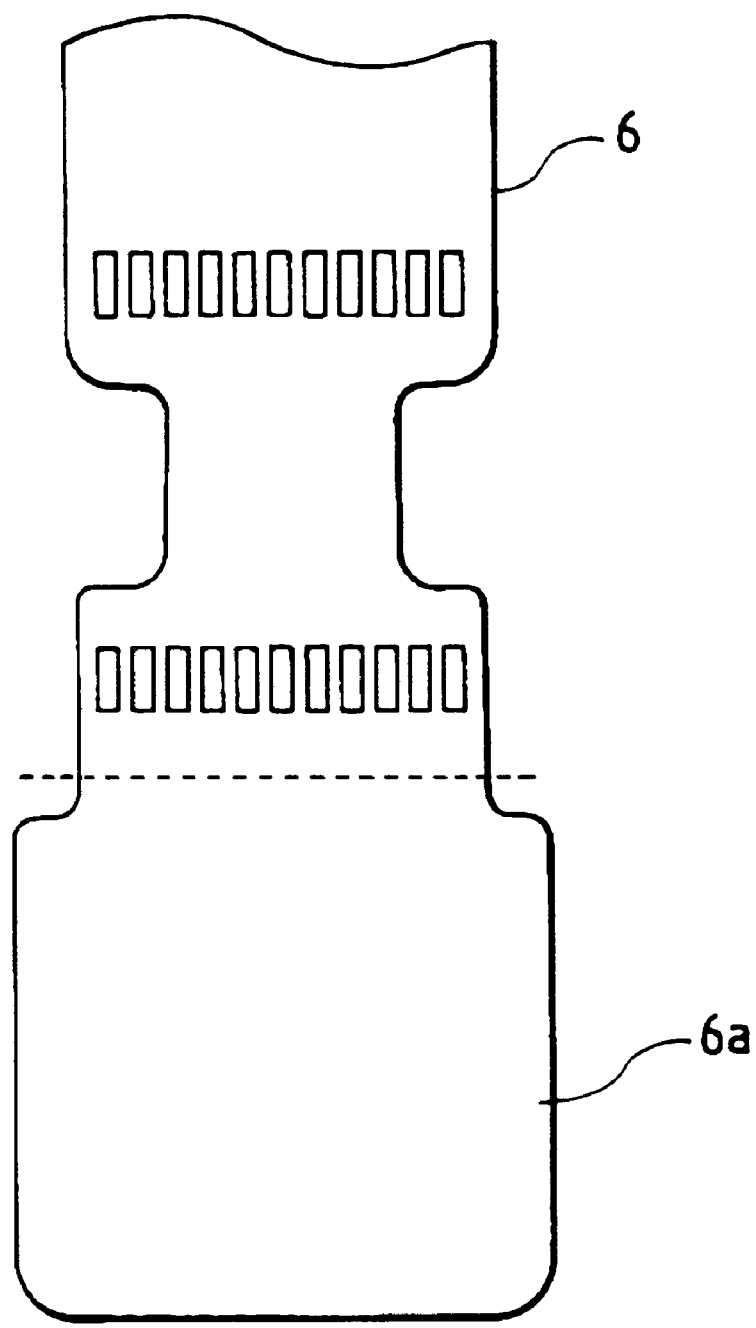
FIG. 7 is a plan view showing the configuration of a printed circuit board employed in the image pickup device constituting a second embodiment of the present invention.

In a second embodiment of the present invention shown in FIG. 7, a ground pattern is formed in an extended portion 6a of the printed circuit board 6, and, after the solid-state image pickup package 1 and the position defining member 3 are fixed by adhesion, the extended portion 6a is folded back over the position defining member thereby completely covering the rear face of the package 1 and obtaining a higher shielding effect.

In the foregoing embodiments, the printed circuit board 6 is composed of a flexible printed circuit board, but it may also be composed of a hard board except in the second embodiment in which the extended portion 6a is to be folded.

As explained in the foregoing, there is obtained an effect of reducing the entire thickness as the gaps of the electric signal output means, the photoelectric conversion means and the position defining means can be reduced.

Also there is obtained an advantage of obtaining the shield effect without employing the shield case which has been a factor of increasing the entire thickness.

In the following there will be explained a third embodiment of the present invention, providing a package for the solid-state image pickup element having a position defining face on the rear face of the package. More specifically there is disclosed a package for a solid-state image pickup element for use in an image pickup device, comprising an image pickup optical system, a solid-state image pickup package of a chip carrier type containing a solid-state image pickup element, a position defining member for defining the position of the solid-state image pickup package relative to the optical system, and a printed circuit board having rands for electrical connection with the solid-state image pickup element, wherein a step difference is formed, on the rear face thereof, between a mounting face for the position defining member and a face for electrical connection with the printed circuit board.

In such configuration, the step difference between the mounting face of the solid-state image pickup package for mounting the position defining member and the electrical connecting face with the printed circuit board can be selected close to the thickness of the position defining member, whereby the dimension of the package can be uniquely and precisely determined to eliminate the dead space.

Figure 8:
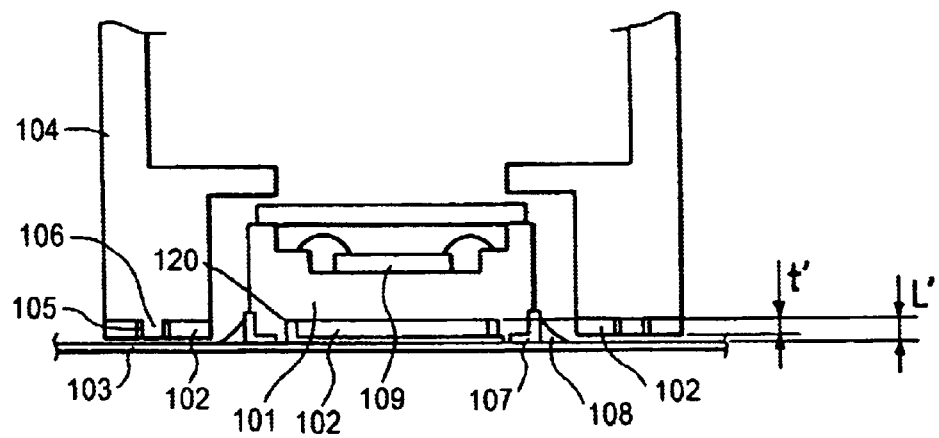
FIG. 8 is a schematic view showing the mounting method for the solid-state image pickup element in a third embodiment of the present invention.
Figure 9:
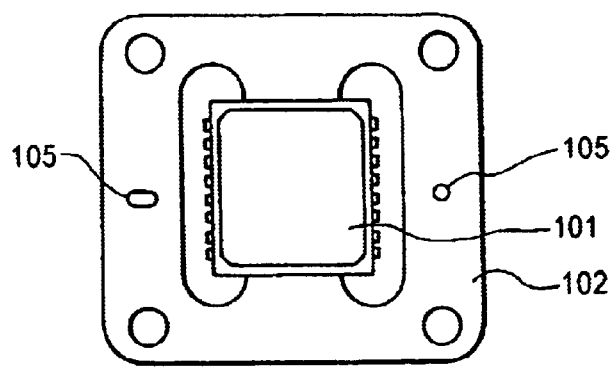
FIG. 9 is a plan view showing the relationship between the package for the solid-state image pickup element and the position defining member in the third embodiment.

FIG. 8 is a schematic view showing the mounting method of the solid-state image pickup element in the present embodiment, and FIG. 9 is a plan view of the solid-state image pickup package and the position defining member.

There are shown a solid-state image pickup package 101; a position defining member 102; a printed circuit board 103; an image pickup optical system 104; holes/projections 105/106; electrode portions 107; soldering portions 108; and a solid-state image pickup element (CCD) 109.

The solid-state image pickup package 101 is of chip carrier type, and is provided, on the rear face thereof, with a step 120 having a difference of height L' between a mounting face for the position defining member 102 and a face to be soldered to the printed circuit board 103 so as to satisfy a condition $t' \leq L'$ wherein t' is the thickness of the position defining member 102.

Figure 10:
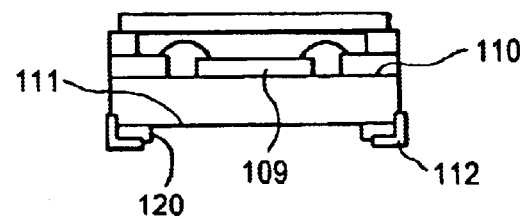
FIG. 10 is a cross-sectional view of the package for the solid-state image pickup element in the third embodiment.

As the solid-state image pickup package 101 is composed, as shown in a cross section in FIG. 10, by laminating ceramic wafers, there can be uniquely and precisely determined a mounting face 110 for the solid-state image pickup element, a mounting face 111 for the position defining member and an electrical connection face 112 to be soldered to the printed circuit board 103.

The position defining member 102 defines the position of the solid-state image pickup element 109 in the axial direction by impingement on the mounting face 111, for the position defining member, of the package 101. Also the position of the package 101 relative to the position defining member 102 in the plane perpendicular to the optical axis is defined by the adhesion of the package 101 to the position defining member 102, utilizing a positioning jig therefor.

Figure 11:
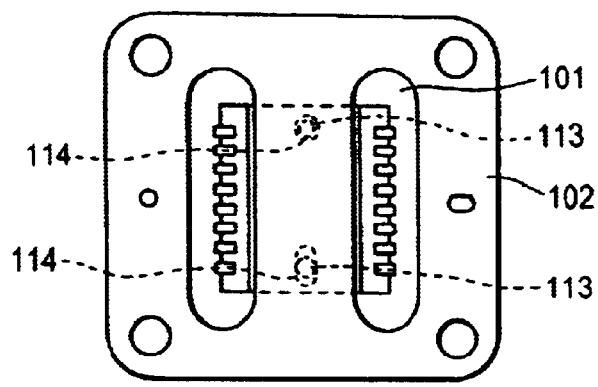
FIG. 11 is a view showing an example of the position defining method for the solid-state image pickup element relative to the position defining member in the third embodiment.
Figure 12:
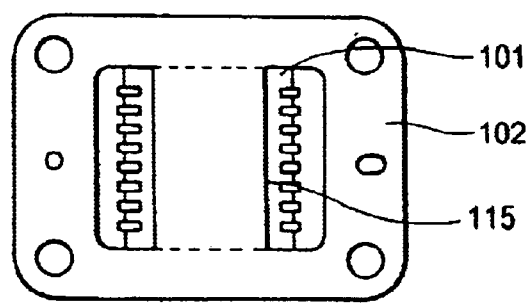
FIGS. 12 and 13 are views showing examples of the position defining method for the solid-state image pickup element relative to the position defining member in the embodiments of the present invention.

In such configuration, the position of the solid-state image pickup element 109 in the plane perpendicular to the optical axis may be defined either, for example as shown in FIG. 11, by the engagement of holes 113 formed on the package 101 and corresponding projections 114 formed on the position defining member 102, or, as shown in FIG. 12, by defining the position of the position defining member 102 by stepped portions 115 and lateral end faces thereof, formed on the solid-state image pickup package 101.

Figure 13:
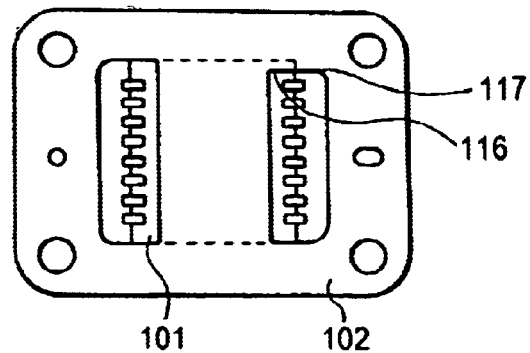

In addition, in order to prevent the mounting of the solid-state image pickup package 101 in an opposite direction to the position defining member 102, the package 101 is preferably provided, as shown in FIG. 13, with a stepped portion 116 for preventing such mounting in the opposite direction and the position defining member 102 is likewise provided with an extended portion 117 for preventing such mounting in the opposite direction.

The electrode portions 107 of the package 101 of which position is defined by the position defining member 102 are soldered, as explained in the foregoing, to the rands formed on the printed circuit board 103 at the side of the solid-state image pickup package 101.

The position of the solid-state image pickup element 109 relative to the image pickup optical system 104 in the axial direction is defined by the impingement of the position defining member 102 on the pick up optical system 104. Also the position of the solid-state image pickup element 109 relative to the image pickup optical system 104 in the direction of the plane perpendicular to the optical axis is defined by the engagement of the holes 105 formed on the position defining member 102 with the corresponding projections 106 formed on the image pickup optical system 104.

The above-described configuration ensures the dimensional precision between the mounting face 110 of the solid-state image pickup element 109 and the mounting face 111 of the position defining member 102. Also the dead space can be eliminated since the step difference, between the mounting face 111, for the position defining member, of the package 101 and the face thereof for electrical connection with the printed circuit board 103, is close to the thickness of the position defining member 102. Furthermore, as the electrode portions of the solid-state image pickup package are electrically connected to the front face of the printed circuit board, there can be eliminated the dead space on the rear face of the printed circuit board, which has been a drawback in the conventional configuration.

Figure 14:
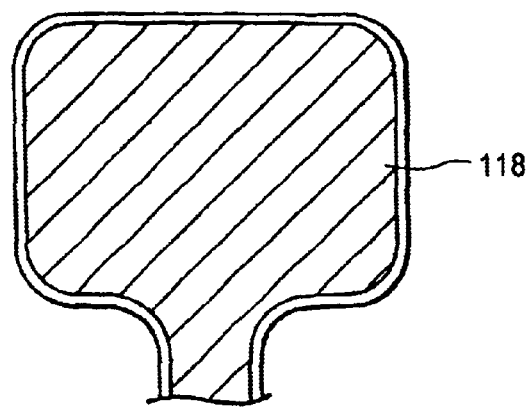
FIG. 14 is a view showing an example of the ground pattern in the embodiments of the present invention.
Figure 15:
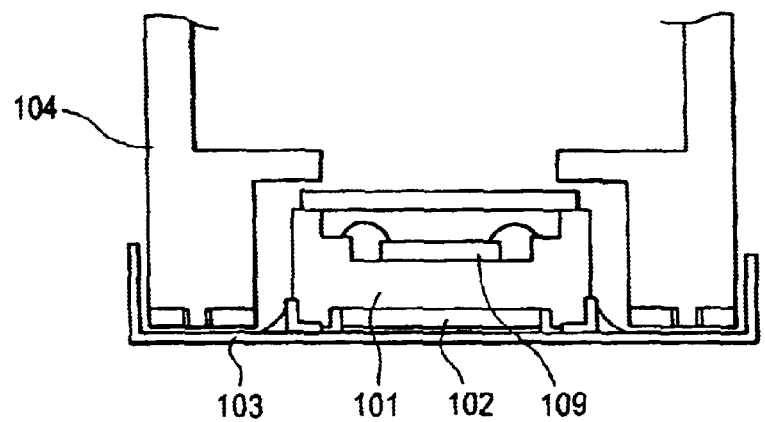
FIG. 15 is a view showing the shape of the board folded in a box shape in the embodiments of the present invention.

Furthermore, the above-described configuration allows obtaining a shield effect which is effective for the solid-state image pickup element susceptible to noises, by forming, as shown in FIG. 14, a ground pattern 118 so as to substantially cover the printed circuit board 103 on a face of the printed circuit board 103 opposite to the electrical connecting face thereof and preferably connecting such ground pattern to a predetermined potential (including ground potential). In such case, the printed circuit board 103 may be so folded in a box shape, as shown in FIG. 15, as to substantially cover the solid-state image pickup package 101 in order to attain further enhanced shield effect.

Figure 16:
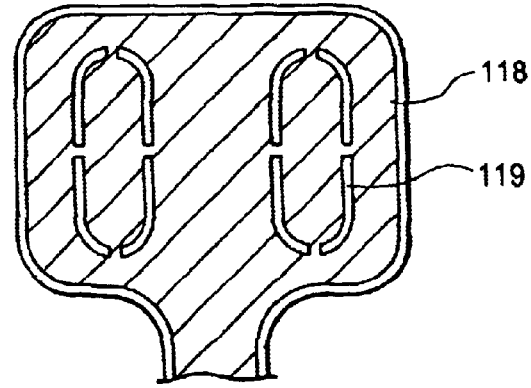
FIG. 16 is a view showing an example of the ground pattern in the embodiments of the present invention.

Furthermore, thus formed ground pattern 118 may be provided, as shown in FIG. 16, with slit portions 119 so as to surround rear face areas corresponding to the rands, thereby preventing the heat loss in soldering the solid-state image pickup package 101.

The above-mentioned ground pattern may be provided at least in a size approximately the same as that of the rear face of the solid-state image pickup package and directly behind the package, in order to prevent the noises entering the package from the rear face side thereof.

As explained in the foregoing, in the package for the solid-state image pickup element for use in an image pickup device including an image pickup optical system, a package of the chip carrier type containing a solid-state image pickup element, a position defining member for defining the position of the package relative to the optical system, and a printed circuit board having rands for electrical connection with the solid-state image pickup element, the package comprises a step difference between a mounting face on the rear face of the package for mounting the position defining member and a face of the package for electrical connection with the printed circuit board whereby such step difference can be selected close to the thickness of the position defining member and the dimension of the package can be uniquely and precisely determined to eliminate the dead space.

Also the dead space at the rear face side of the printed circuit board, which has been a drawback in the conventional configuration, can be eliminated since the electrode portions of the solid-state image pickup package are electrically connected at the front face of the printed circuit board.

Furthermore, a shield effect against noises can be obtained without utilizing a shield case.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus comprising:
   an image pickup unit which picks up an object image;
   an electrode arranged on said image pickup unit;
   a first board having a wiring pattern arranged thereon which outputs a signal from said electrode;
   an optical system arranged to focus the object image onto said image pickup unit;
   a second board to which said optical system is fixed, said second board having a projection; and
   a connection member arranged to connect said first board and said electrode,
   wherein said first board is positioned between said image pickup unit and said second board, said connection member is arranged on a surface of said first board facing said image pickup unit, and said image pickup unit is arranged in contact with said projection of said second board.

2. An apparatus according to claim 1, wherein said image pickup unit includes an image pickup element and a package on which said image pickup element is arranged.

3. An apparatus according to claim 1, wherein said first board is a printed circuit board.

4. An electrical part mounting apparatus comprising:
   an electrical part;
   an electrode arranged on said electrical part;
   a first board having a wiring pattern arranged thereon which outputs a signal from said electrode;

a second board to which said electrical part is fixed, said second board having a projection; and a connection member arranged to connect said first board and said electrode, wherein said first board is arranged between said electrical part and said second board, said connection member is arranged on a surface of said first board facing said electrical part, and said electrical part is arranged in contact with said projection of said second board.

5. An image pickup apparatus comprising:

an image pickup unit which picks up an object image;

an electrode portion provided for said image pickup unit;

a first board having a wiring pattern arranged thereon which outputs a signal from said electrode portion;

a connection member which connects said first board and said electrode portion, wherein said connection member connects said first board and said electrode portion on a surface of said first board facing said image pickup unit;

an optical system arranged to focus the object image onto said image pickup unit; and a second board which is arranged between said image pickup unit and said first board and to which said optical system is fixed, wherein said second board has an opening which is positioned above said connection member, and at least a portion of said connection member is positioned above a surface of said second board facing said first board.

6. An apparatus according to claim 5, wherein said image pickup unit includes an image pickup element and a package on which said image pickup element is arranged.

7. An apparatus according to claim 5, wherein said first board is a printed circuit board.

* * * * *

UNITED STATES PATENT AND TRADEMARK OFFICE
CERTIFICATE OF CORRECTION

PATENT NO. : 6,654,064 B2  Page 1 of 1
DATED : November 25, 2003
INVENTOR(S) : Koji Ishikawa It is certified that error appears in the above-identified patent and that said Letters Patent is hereby corrected as shown below:

Column 3,
Line 6, "pair" should read -- pairs --.

Signed and Sealed this

Fifth Day of April, 2005

JON W. DUDAS
*Director of the United States Patent and Trademark Office*